(12) United States Patent
Tan et al.

(10) Patent No.: US 12,204,442 B2
(45) Date of Patent: Jan. 21, 2025

(54) DYNAMIC VOLTAGE SUPPLY FOR MEMORY CIRCUIT

(71) Applicant: Micron Technology, Inc., Boise, ID (US)

(72) Inventors: Hua Tan, Shanghai (CN); Junjun Wang, Shanghai (CN); De Hua Guo, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/414,299

(22) PCT Filed: Apr. 27, 2021

(86) PCT No.: PCT/CN2021/090275
§ 371 (c)(1),
(2) Date: Jun. 15, 2021

(87) PCT Pub. No.: WO2022/226783
PCT Pub. Date: Nov. 3, 2022

(65) Prior Publication Data
US 2024/0126685 A1    Apr. 18, 2024

(51) Int. Cl.
*G11C 16/04* (2006.01)
*G06F 12/02* (2006.01)

(52) U.S. Cl.
CPC ................ *G06F 12/0246* (2013.01)

(58) Field of Classification Search
CPC .................................. G06F 12/0246
See application file for complete search history.

(56) References Cited

U.S. PATENT DOCUMENTS

| | | | |
|---|---|---|---|
| 6,868,025 B2 * | 3/2005 | Hsu ...................... | G11C 11/5685 365/213 |
| 7,986,579 B2 * | 7/2011 | Akaogi .................. | G11C 7/067 365/207 |
| 8,300,484 B2 * | 10/2012 | Yoshida ................. | G11C 7/067 365/194 |
| 10,908,845 B1 | 2/2021 | Lang et al. | |

(Continued)

OTHER PUBLICATIONS

"International Search Report and Written Opinion of the International Searching Authority," issued in connection with Int'l Appl. No. PCT/CN2021/090275, dated Jan. 26, 2022, 9 pages.

*Primary Examiner* — Pho M Luu
(74) *Attorney, Agent, or Firm* — Holland & Hart LLP

(57) ABSTRACT

Methods, systems, and devices for dynamic voltage supply for memory circuit are described. An apparatus may adjust a supply voltage based on a process corner and a temperature of the memory system. An apparatus may include a memory array and a controller. The controller may determine a first temperature of the apparatus is less than a first temperature threshold at a first time. The controller may transition a voltage supplied to the controller from a first voltage level to a second voltage level based on determining the first temperature is less than the first temperature threshold. The controller may determine a second temperature is greater than a second temperature threshold at a second time. The controller may transition the voltage supplied to the controller from the second voltage level to the first voltage level based on determining the second temperature is greater than the second temperature threshold.

35 Claims, 7 Drawing Sheets

(56) References Cited

U.S. PATENT DOCUMENTS

2009/0016140 A1   1/2009   Qureshi et al.
2012/0159216 A1   6/2012   Wells et al.
2012/0243364 A1   9/2012   Hacking et al.
2017/0357298 A1   12/2017   Hovis et al.
2020/0097217 A1   3/2020   Yeh \* cited by examiner

DYNAMIC VOLTAGE SUPPLY FOR MEMORY CIRCUIT

CROSS REFERENCE

The present application for patent is a 371 national phase filing of International Patent Application No. PCT/CN2021/090275 by TAN et al., entitled "DYNAMIC VOLTAGE SUPPLY FOR MEMORY CIRCUIT," filed Apr. 27, 2021, assigned to the assignee hereof, and expressly incorporated by reference herein.

FIELD OF TECHNOLOGY

The following relates generally to one or more systems for memory and more specifically to dynamic voltage supply for memory circuit.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
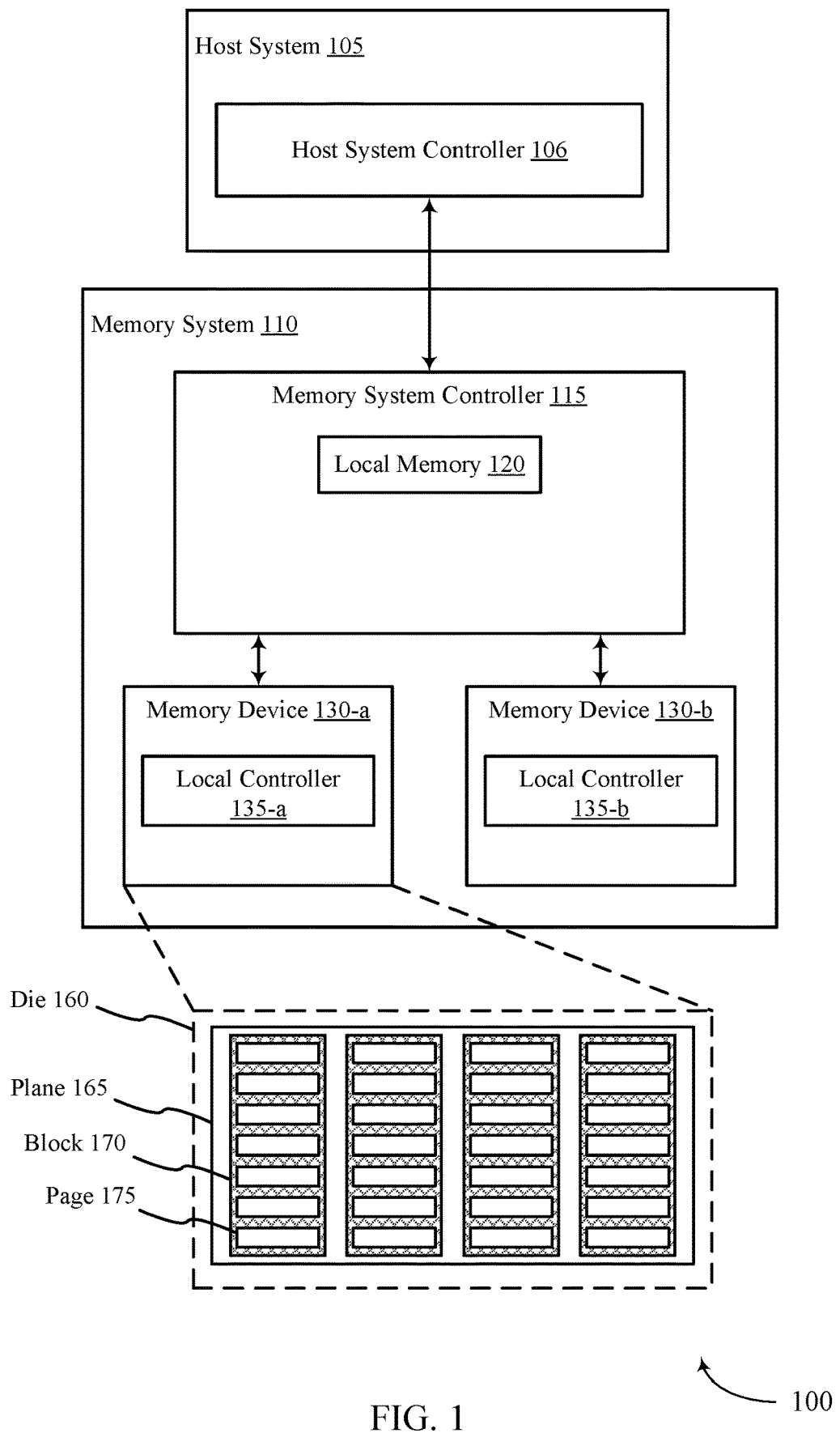
FIG. 1 illustrates an example of a system that supports dynamic voltage supply for memory circuit in accordance with examples as disclosed herein.

A system may include a memory system and a host system coupled with the memory system. The memory system may be supplied power by the host system, in some cases. In some examples, the memory system may include application specific integrated circuits (ASICs). For example, the ASIC may be used in the memory system controller—e.g., an MAND controller or SSD controller. The ASICs in the memory system may include deviations due to the fabrication process—e.g., the ASICs may have process corners. For example, the memory system controller may include components with a normal saturated threshold voltage and normal saturated current (e.g., typical (T)), components with a higher saturated threshold voltage and lower saturated current (e.g., slow (S)), or components with a lower saturated threshold voltage and higher saturated current (e.g., fast (F)). That is, the memory system controller may include process corners TT, SS, FF, FS, and SF. In some examples, the memory system performance may also be affected by temperature. For example, the memory system may be an example of an autonomous vehicle system that experiences high and low temperatures based on the location of the system. Low temperatures may cause the memory system controller components to be slower than typical and higher temperatures may cause the memory system controller components to be faster than typical. In some cases, some process corners may be affected more than others by the temperature. For example, a memory system controller with a high distribution of SS components may fail at low temperatures as the components are too slow to start up while a memory system controller with a high distribution of FF components may fail at high temperatures as the components may have high currents that cause a voltage drop in the power supply. Accordingly, a memory system may experience reduced performance based on temperature and a process corner in the memory system.

Systems, techniques, and devices are described herein for a dynamic voltage supply to the memory system controller based on temperature and a process corner deviation in the memory system. For example, the memory system may determine a saturated threshold voltage and a saturated current for components of associated with a memory system controller of the memory system. The memory system may determine a first voltage level and a second voltage level for a voltage supplied to the memory system controller based on determining the saturated threshold voltage and saturated current after manufacturing—e.g., based on determining if the memory system controller is SS, TT, FF, FS, or SF. The memory system may also transition from the first voltage level to the second voltage level or vice versa based on a temperature of the memory system. For example, the memory system may determine a temperature at a first time and compare the temperature to a first temperature threshold and a second temperature threshold. A dynamic voltage may be supplied to the memory system controller to compensate for variations in the process corners and the temperatures.

In some cases, the memory system may use a multi-threshold analysis to determine what voltage to supply. The memory system may utilize the first voltage level if the temperature is greater than the first temperature threshold and the second temperature threshold. The memory system may utilize the second voltage level if the temperature is less than the first temperature threshold and the second temperature threshold—e.g., the memory system may transition the voltage supplied to the memory system controller from the first voltage to the second voltage. If the memory system determines the temperature is between the first temperature threshold and the second temperature threshold, the memory system may maintain the voltage supplied to the memory system controller at its current level—e.g., if the first voltage level is being supplied at the time the temperature is measured, the first voltage level may be maintained. That is, there may be a range of temperatures between the first temperature threshold and the second temperature thresholds to avoid constant transitions between the first and second voltage levels.

By utilizing the dynamic voltage supplied to the memory system controller, the memory system may increase performance and reliability. For example, the memory system controller may have a higher voltage supplied at low temperatures to ensure the SS components are turned on fast enough and a lower voltage supplied at higher temperatures to ensure the FF components do not cause a voltage drop by the increased peak current.

Features of the disclosure are initially described in the context of systems, devices, and circuits as described with reference to FIG. 1. Features of the disclosure are described in the context systems, diagrams, and process diagrams as described with reference to FIGS. 2-5. These and other features of the disclosure are further illustrated by and described with reference to an apparatus diagram and a flowchart that relate to dynamic voltage supply for memory circuit as described with reference to FIGS. 6 and 7.

FIG. 1 illustrates an example of a system 100 that supports dynamic voltage supply for memory circuit in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an ASIC, a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may in some cases instead be performed by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programmed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

The system 100 may include any quantity of non-transitory computer readable media that support dynamic voltage supply for memory circuit. For example, the host system 105, the memory system controller 115, or a memory device 130 may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

In some examples, memory system controller 115 components may have slight variations due to a fabrication process. For example, memory system controller 115 may include different ASICs. In some examples, memory system controller 115 components may have process corners. For example, some memory system controller 115 components may have a normal saturated threshold voltage and saturated current (e.g., TT), other components may have a higher saturated threshold voltage and lower saturated current (e.g., SS), and other components may have a lower saturated threshold voltage and higher saturated current (e.g., FF). Each component may also have a different threshold voltage. In some examples, the memory system controller 115 components may also have varying performance due to a temperature of the memory system 110—e.g., SS components may have reduced performance at lower temperatures as they cannot turn on fast and FF components may have reduced performance at higher temperatures as they have extremely high current and cause a voltage drop. In such examples, the memory system 110 may experience a reduction in performance based on the process corner and the temperature.

As described herein, the memory system 110 may provide a dynamic voltage to the memory system controller 115 based on process corner deviations and temperature. For example, the memory system controller 115 may determine a type of process corner present in the system 100 based on determining saturated threshold voltage and saturated current for each component. The memory system controller 115 may select one or more voltages to dynamically supply to the memory system controller based on the type of process corner determined.

The memory system controller 115 may also determine a voltage that increases performance based on the temperature—e.g., a lower threshold temperature for an FF component at high temperatures to avoid voltage drops. The memory system controller 115 may then determine the temperature at a given time and compare the temperature to a first temperature threshold and a second temperature threshold. If the temperature is greater than both the first temperature threshold and the second temperature threshold, the memory system controller 115 may transition to a first threshold voltage. If the temperature is less than both the first temperature threshold and the second temperature threshold, the memory system controller 115 may transition to a second threshold voltage. If the temperature is between the first temperature threshold and the second temperature threshold, the memory system controller 115 may maintain the voltage supplied. By utilizing the dynamic voltage, the memory system 110 may increase performance and reduce peak current and the voltage drop.

Figure 2:
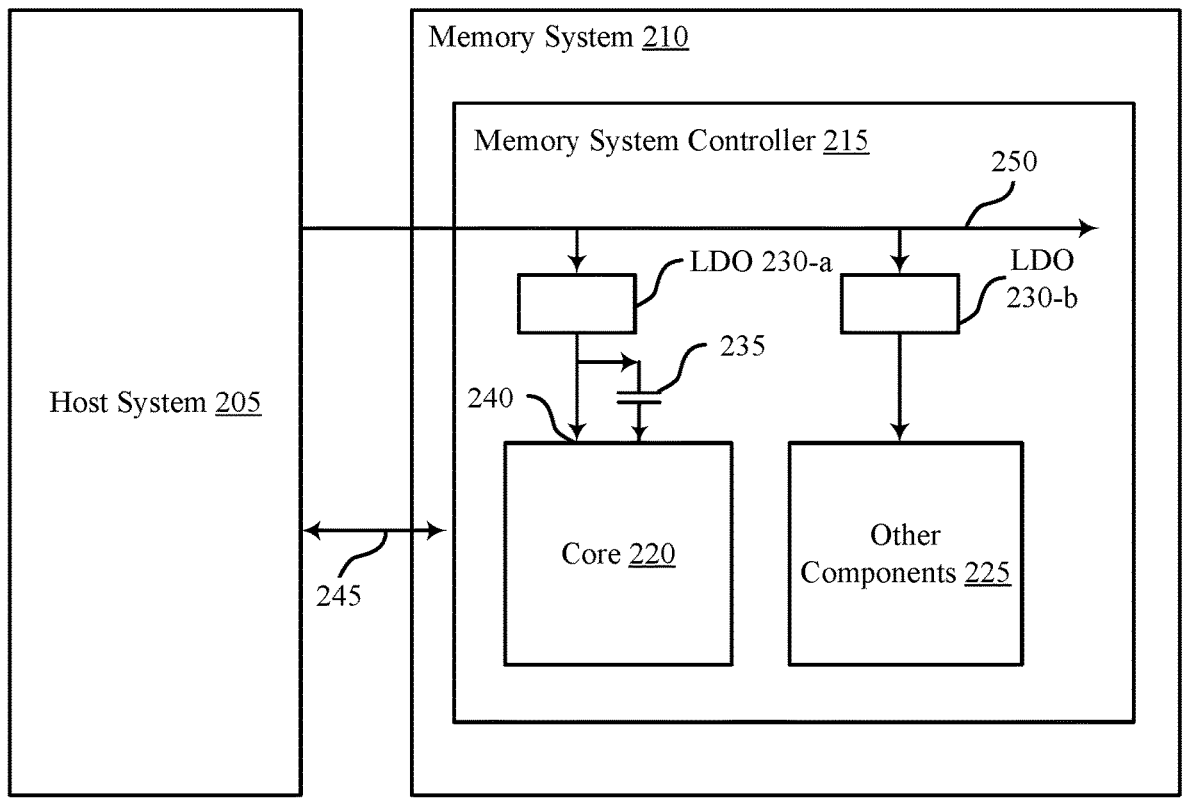
FIG. 2 illustrates an example of a system that supports dynamic voltage supply for memory circuit in accordance with examples as disclosed herein.

FIG. 2 illustrates an example of a system 200 that supports dynamic voltage supply for memory circuit in accordance with examples as disclosed herein. System 200 may be an example of system 100. System 200 may include a host system 205 and a memory system 210. Host system 205 may be an example of host system 105, as described with reference to FIG. 1. Memory system 210 may be an example of memory system 110, as described with reference to FIG. 1. The memory system 210 may also include a memory system controller 215 which may be an example of memory system controller 115 as described with reference to FIG. 1. The system 200 may also include a data bus 245 coupling the host system 205 and the memory system 210 and a power supply line 250 supplying a voltage from the host system 205 to the memory system 210. The memory system controller 215 may also include a core 220, other components 225, a low dropout regulator (LDO) 230-a and 230-b.

Host system 205 may be configured to supply a voltage (e.g., VCCQ) to the memory system 210 via the power supply line 250. In some examples, the host system 205 may supply 1.2 volts to the memory system 210. The host system 205 may also be configured to communicate data and control signal to the memory system 210 via the data bus 245. For example, the host system 205 may transmit access commands (e.g., read, write, or refresh commands) and data to be written to the memory system 210.

Memory system controller 215 may be configured to receive a voltage supplied by the host system 205 via the power supply line 250. The memory system controller 215 may also be configured to receive control signals and data from the host system 205 via the data bus 245. In some examples, the memory system controller 215 may also communicate data to the host system 205 over the data bus 245—e.g., in response to a read command.

Core 220 may be configured to read instructions, perform calculations, and execute operations received at the memory system controller 215—e.g., the core 220 may also be known as a "CPU core." That is, the core 220 may process commands received from the host system 205 and translate them into instructions for memory devices (e.g., memory devices 130 as described with reference to FIG. 1) coupled with the memory system controller 215. The core 220 may also be configured to receive information from the memory devices and translate them into response for the host system 205. The core 220 may also include an ASIC with various process corners. The core 220 may also be configured to receive a voltage from the LDO 230-a.

Other components 225 may include peripheral components that enable the memory system controller 215 to perform and execute instructions from the host system 205. For example, in a NAND or MNAND memory system, the other components 225 may be examples of an ONFI interface or NAND flash memory. Other components 225 may be configured to receive a voltage from the LDO 230-b.

LDO 230-a and LDO 230-b may be configured to regulate the voltage from the power supply line 250 received from the host system 205 to provide a different voltage to the core 220 and other components 225 respectively. That is, in some examples, the voltage provided by the host system 205 may fluctuate—e.g., the host system 205 may provide a voltage between 1.1 volts and 1.3 volts. The LDO 230 may regulate that voltage to supply a more consistent voltage to the core 220 and the other components 225. In other examples, the core 220 may have a first operating voltage different than a second operating voltage of the other components 225. In such examples, the LDO 230-a and LDO 230-b may be utilized to regulate the voltage supplied by the power supply line 250—e.g., the LDO 230-a may regulate the voltage from the power supply line 250 to provide the first operating voltage to the core 220 and the LDO 230-b may regulate the voltage from the power supply line 250 to provide the second operating voltage to the other components 225. The LDO 230 may be configured to have a variable resistance to regulate the voltage form the power supply line 250—e.g., the memory system 210 may increase or decrease the resistance of the LDO 230-a to change the voltage 240 provided to the core 220. The capacitor 235 may also be configured to regulate the voltage from the LDO 230-a to the core 220.

In some examples, the memory system controller 215 and the ASIC's in the memory system controller 215 may have deviations (e.g., process corners) that result from variations in the fabrication and manufacturing process. For example, the memory system controller 215 may include transistor pairs—e.g., a pair of N-channel metal-oxide-semiconductor logic (NMOS) and P-channel metal-oxide-semiconductor logic (PMOS) transistors. Due to the fabrication and manufacturing process, there may be deviations in the characteristics of the transistors. For example, transistors in the core 220 may be considered typical (T), slow (S), or fast (F). In such examples, the core 220 may include five (5) different configurations of process corners; TT, SS, FF, FS, and SF. Transistor pairs with an SS process corner may have a higher saturated threshold voltage and lower saturated current when compared with typical transistors—e.g., they utilize more voltage and have a slower performance level. Transistor pairs with an FF process corner may have a lower saturated threshold voltage and higher saturated current when compared with typical transistors—e.g., they utilize less voltage and have a faster performance level.

Additionally or alternatively, the core 220 may be utilized at various different temperatures. For example, the memory system 210 may be an example of an automotive system and experience a relatively large range of possible temperatures—e.g., from −40° Celsius to 105° Celsius. In some examples, the core 220 performance may be affected by the temperature—e.g., the core 220 components may be slow at low temperatures and fast at high temperatures. For example, SS transistors may fail in low temperatures because they cannot turn on fast enough. In other examples, FF transistors may have an extremely high current at high temperatures and cause a voltage drop—e.g., the voltage supplied by the host system 205 on the power supply line 250 may drop due to the high current. In either case, the memory system 210 may experience reduced performance due to the temperature.

As described herein, the memory system 210 may dynamically configure the voltage 240 supplied to the core 220 based on the temperature and the process corner of components associated with the core 220. For example, the memory system 210 may determine a first voltage level (e.g., a first voltage 240) to supply the core 220 based on a first temperature threshold and process corner and a second voltage level (e.g., a second voltage 240) to supply to the core 220 based on a second temperature threshold and process corner. The memory system 210 may write a value associated with the corresponding voltages in a register or adjust trim settings of the memory system 210 accordingly. The memory system 210 may also be configured to detect a temperature of the core 220 and supply the first voltage level or the second voltage level based on the temperature, the first temperature threshold, and the second temperature threshold as described with reference to FIG. 3. By dynamically adjusting the voltage 240, the memory system 210 may increase performance and reduce peak current.

Figure 3:
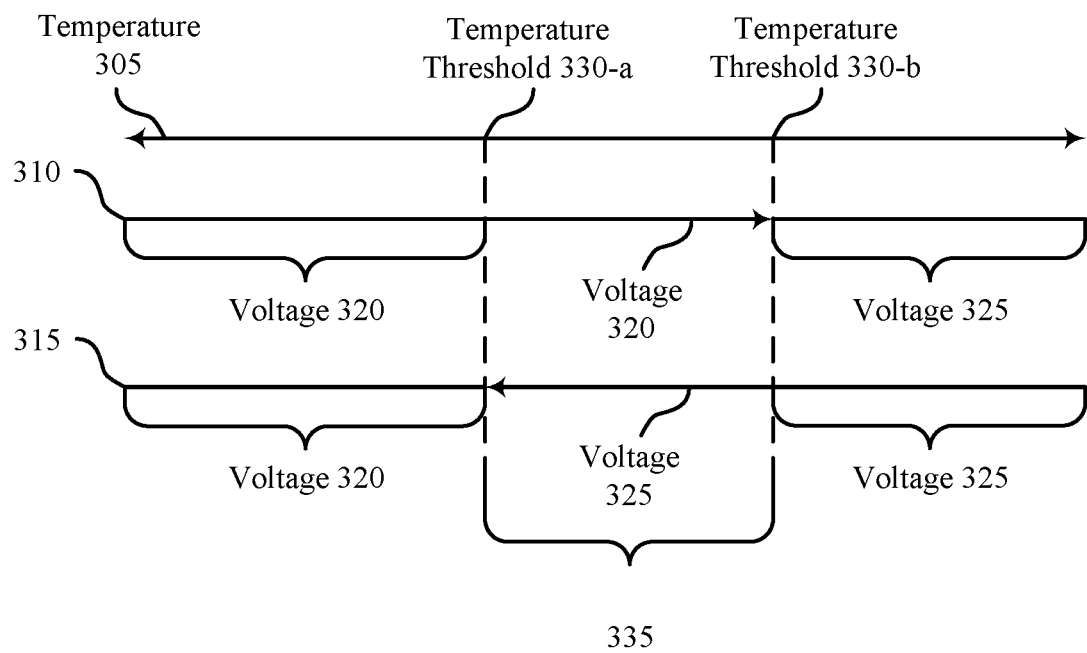
FIG. 3 illustrates an example of a diagram that supports dynamic voltage supply for memory circuit in accordance with examples as disclosed herein.

FIG. 3 illustrates an example of a diagram 300 that supports dynamic voltage supply for memory circuit in accordance with examples as disclosed herein. Diagram 300 may be an example of a system (e.g., system 100) utilizing a dynamic voltage supply to a core (e.g., core 220) of a memory system controller (e.g., memory system controller 215). Diagram 300 may illustrate a temperature 305 of the memory array and a voltage 320 or voltage 325 supplied to the core based on the temperature. Timeline 310 may show an example of a core experiencing a decrease in temperature 305. Timeline 315 may show an example of a core experiencing an increase in temperature 305. Diagram 300 may also illustrate a temperature threshold 330-a and temperature threshold 330-b.

As described with reference to FIG. 2, a memory system (e.g., memory system 210) may include deviations and process corners. The core performance may be affected based on the process corners and a temperature of the core. Accordingly, the memory system controller (e.g., memory system controller 115) may determine a voltage 320 and a voltage 325 to supply to the core based on the process corners and temperature threshold 330-a and temperature threshold 330-b.

In some examples, a memory system controller may determine a process corner for the core. For example, the memory system controller may determine if the core includes FF, SS, TT, SF, or FS process corners based on determining a saturated threshold voltage and a saturated current for transistor pairs and other components associated with or in the core—e.g., if the saturated threshold voltage is high and the saturated current is low, the memory system controller may determine an SS process corner and if the saturated threshold voltage is low and the saturated current is high, the memory system controller may determine an FF process corner. In some cases, each process corner may have a different threshold voltage. For example, a component having an SS process corner may have a higher voltage threshold than a component having a TT or FF process corner—e.g., due to the higher saturated threshold voltage, the SS component may utilize more power to turn on and off. In such examples, the memory system controller may partly determine a voltage to supply to the core based on the process corner determined.

Additionally or alternatively, a temperature 305 of the core may also affect the performance of the components of the core. For example, memory cells may perform slower at a lower temperature 305 and faster at a higher temperature 305. The process corners may also be affected by the temperature 305. For example, an SS process corner component may be slower to turn on at a lower temperature 305 and an FF process corner component may have a high current at a higher temperature 305 that causes a voltage drop on the voltage supplied to the core (e.g., the voltage supplied by the power supply line 250 as described with reference to FIG. 2). In such examples, the memory system controller may partly determine the voltage to supply to the core based on the performance of the components in high and low temperatures 305—e.g., a voltage supplied to an FF corner at a high temperature 305 may be less than a voltage supplied to an SS corner at the same high temperature 305. The following table (e.g., Table 1) may illustrate one example of possible voltage configurations based on process corner and temperature:

TABLE 1

|  | TT | SS Type 1 | SS Type 2 |
|---|---|---|---|
| Voltage 320 | 0.782 V | 0.8 V | 0.817 V |
| Voltage 325 | 0.817 V | 0.817 V | 0.817 V |

The memory system controller may determine a threshold voltage for the core based on the process corner—e.g., based on determining a TT, SS type 1, or SS type 2 process corner. For example, the memory system controller may determine a higher threshold voltage for the SS type 1 and SS type 2 as both components may utilize more voltage to turn on. The memory system controller may also determine a voltage 320 for when the temperature 305 is greater than the temperature threshold 330-a and a voltage 325 for when the temperature 305 is less than the temperature threshold 330-b. For example, the memory system controller may determine a higher voltage 325 for process corners TT and SS type 1 based on the performance of the components at temperatures 305 below the temperature threshold 330-b. Although not shown in Table 1, the memory system controller may utilize a similar process to determine voltage values for an FF process corner—e.g., the memory system controller may determine a lower threshold voltage. The memory system controller may store values corresponding to the voltage 320 and the voltage 325 in a register or update trim settings to reflect the determined voltage 320 and voltage 325.

After determining the voltage 320 and voltage 325 during (or immediately after) the manufacturing process, the memory system controller may utilize the determined voltage 320 and voltage 325 based on temperature 305 change as illustrated in diagram 300. In some examples, the memory system controller may determine a temperature of the core after detecting an event during the operation of the memory system. For example, the memory system controller may determine a temperature 305 after the memory system is powered on—e.g., the core goes from a deactivated state to the default voltage (e.g., voltage 320). In other examples, the memory system controller may determine a temperature 305 after determining the power of the core is reset. In some instances, the memory system controller may determine a temperature 305 after the memory system controller receives a link stop and start request from a host system (e.g., host system 205 as described with reference to FIG. 2). In some cases, the memory system controller may determine a temperature 305 after the memory system exits a low-power state mode (e.g., a power saving mode). In other instances, the memory system controller may determine a temperature 305 after receiving an enter hibernate command. In some examples, the memory system controller may experience a delay in detecting the event and determining the temperature—e.g., the memory system controller may take up to two (2) milliseconds (ms) to determine the temperature after detecting a power on event, a power reset, a link reset request, or exiting a hibernate status. In some examples, the memory system controller may experience a smaller delay in detecting the event and determining the temperature based on the event—e.g., the memory system controller may determine a temperature as part of entering a hibernate state and experience a smaller delay (e.g., two (2) microseconds (μs)) in getting the temperature.

After detecting an event and determining a first temperature 305 at a first time on the timeline 310, the memory system controller may compare the determined temperature 305 to the temperature threshold 330-a and the temperature threshold 330-b. If the memory system controller determines the first temperature 305 exceeds the temperature threshold 330-a and the temperature threshold 330-b, the memory system controller may maintain the voltage 320. The memory system may then determine a second event—e.g., another power on, power reset, link request, hibernate exit or enter—and determine a second temperature 305 at a second time. If the memory system controller determines the second temperature is less than the temperature threshold 330-a but greater than the temperature threshold 330-b, the memory system controller may maintain the voltage 320. In some examples, the memory system controller may also determine a third temperature at a third time after a third event. If the memory system controller determines the third temperature is less than both the temperature threshold 330-a and the temperature threshold 330-b, the memory system controller may transition the voltage supplied to the core from voltage 320 to the voltage 325. In some examples, the memory system controller may transition the from voltage 320 to voltage 325 by adjusting a resistance (e.g., a resistive value) of an LDO (e.g., LDO 230-a as described with reference to FIG. 2). In some cases, the memory system controller may refrain from transitioning a voltage until the memory system is an idle state—e.g., there is a lack of operations being executed at a memory array and memory cells in the memory array are idle. In some cases, the memory system controller may also log the transition of the voltage in an event log stored at a register to maintain information relevant to debugging—e.g., the memory system controller may log the process corner type, the event that occurred, and the transition of the voltage supplied to the core.

If the memory system controller determines an increase in temperature 305 as shown in timeline 315, then the memory system controller may similarly supply the voltage 320 if a determined temperature is greater than the temperature threshold 330-*a* and the voltage 325 if the determined temperature is less than the temperature threshold 330-*b*. In the example where the temperature is increasing, the memory system controller may maintain the voltage 325 if the determined temperature is greater than the temperature threshold 330-*b* and less than the temperature threshold 330-*a*. That is, the diagram 300 may illustrate a temperature threshold window 335 in which the memory system controller may maintain the previous state of the voltage supplied to the memory array if the determined temperature is between the temperature threshold 330-*a* and temperature threshold 330-*b*—e.g., maintain voltage 320 if at the time the temperature is determined, the voltage 320 is utilized to provide power to the core and maintain voltage 325 if at the time the temperature is determined, the voltage 325 is utilized to provide power to the core. That is, the memory system controller may refrain from transitioning between voltage 320 and voltage 325 if the determined temperature is between the temperature threshold 330-*a* and temperature threshold 330-*b*. By utilizing two temperature thresholds 330 and a temperature threshold window 335, the memory system controller may converse power—e.g., the memory system controller may conserve power by avoiding frequent transitioning between voltage 320 and voltage 325 each time a temperature threshold 330 is passed.

Two temperature thresholds 330 are shown for illustrative purposes only. In other examples, the memory system may utilize three, four, five, six, seven, eight, nine, ten, eleven, twelve, thirteen, fourteen, fifteen, sixteen, seventeen or more temperature thresholds. Additionally, the memory system may utilize three, four, five, six, seven, eight, nine, ten, eleven, twelve, thirteen, fourteen, fifteen, sixteen, seventeen or more voltages supplied to the core based on the process corners, temperature, and other factors. In some examples, the memory system may utilize four (4) temperature thresholds and three (3) voltages supplied to the core. For example, diagram 300 may include two additional temperature thresholds between temperature threshold 330-*a* and 330-*b* (e.g., temperature threshold 330-*c* and temperature threshold 330-*d*) and a third voltage supplied to the core. The memory system controller may transition the voltage from the voltage 320 or voltage 325 to the third voltage based on a determined temperature being between a temperature threshold 330-*c* and temperature threshold 330-*d*—e.g., the memory system controller may utilize voltage 320 when above temperature threshold 330-*a*, utilize voltage 325 when below temperature threshold 330-*b*, a third voltage when between temperature threshold 330-*c* and 330-*d*, and maintain a voltage if between temperature threshold 330-*a* and temperature threshold 330-*c* or between temperature threshold 330-*c* and temperature threshold 330-*b*. Other voltage and temperature configurations are possible.

Figure 4:
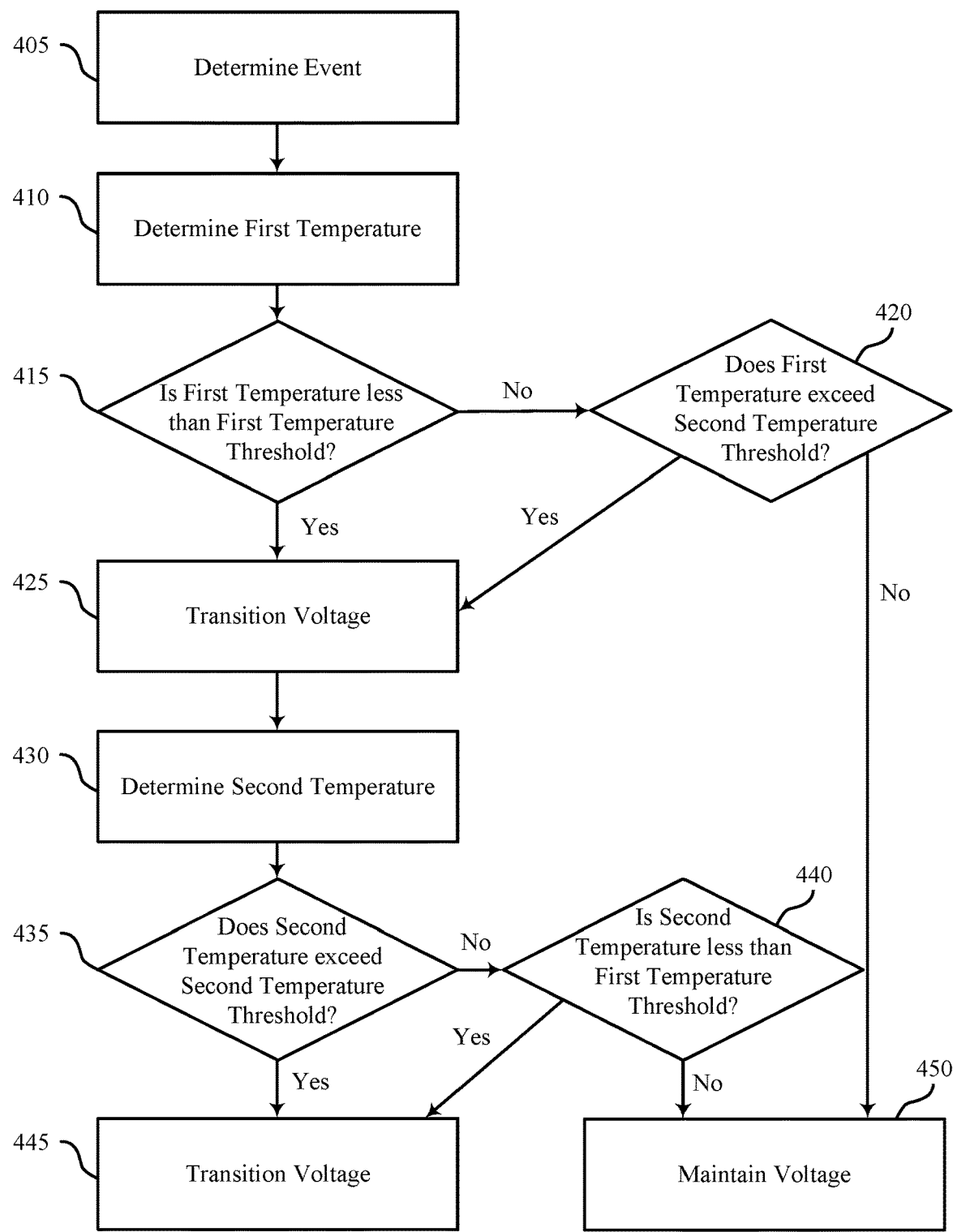
FIG. 4 illustrates an example of a process diagram that supports dynamic voltage supply for memory circuit in accordance with examples as disclosed herein.

FIG. 4 illustrates an example of a process diagram 400 that supports dynamic voltage supply for memory circuit in accordance with examples as disclosed herein. For example, the process diagram 400 may be performed by a system as described with reference to FIGS. 1 and 2 (e.g., system 200, host system 205, and memory system 210 as described with reference to FIG. 2). Although shown in a particular sequence or order, unless otherwise specified, the order of the processes may be modified. Thus, the illustrated examples are used as examples, and the illustrated processes may be performed in a different order, and some processes may be performed in parallel. Additionally, one or more processes may be omitted in various examples. Thus, not all processes are used in every example. Other process diagrams are possible. The process diagram 400 illustrates examples of a memory system dynamically adjusting a voltage supplied to a core (e.g., core 220 as described with reference to FIG. 2.

At 405, an event is determined. For example, a memory system (e.g., memory system 210 as described with 210) may determine an event. The event may be determined at a memory system controller (e.g., memory system controller 115 as described with reference to FIG. 1). In some examples, the memory system controller may identity an event occurring at the memory system. For example, the memory system controller may identify the memory system powering on, identify a reset in a power supplied by a host system (e.g., host system 105 as described with reference to FIG. 1) to the memory system, receive a link stop or link start request from the host system, or identify entering or exiting a hibernate mode—e.g., a low-power state mode.

At 410, a first temperature is determined. For example, the memory system may determine the first temperature. The first temperature may be determined at the memory system controller. In some examples, after detecting or determining an event occurs at the memory system, the memory system controller may determine the first temperature of the core. For example, the memory system controller may utilize a sensor in the memory array configured to determine the first temperature. In some examples, the memory system controller may experience a delay in detecting the event and determining the first temperature.

At 415, whether the first temperature is less than a first temperature threshold is determined. For example, the memory system may determine if the first temperature is less than a first temperature threshold. The determination may be made at the memory system controller. In some examples, the memory system controller may determine a first temperature threshold based on a process corner performance as described with reference to FIG. 3. For example, the memory system controller may determine the first temperature threshold based on an SS process corner performing slower at a lower temperature—e.g., the SS corner may utilize more voltage at a temperature less than the first temperature threshold. The memory system controller may compare the first temperature with the first temperature threshold. If the memory system controller determines the first temperature is not less than the first temperature threshold, it may proceed to block 420. If the memory system controller determines the first temperature is less than the first temperature threshold, it may proceed to block 425.

At 420, whether the first temperature is greater than a second temperature threshold is determined. For example, the memory system may determine if the first temperature exceeds a second temperature threshold. The determination may be made at the memory system controller. In some examples, the memory system controller may determine a second temperature threshold based on a process corner performance as described with reference to FIG. 3. For example, the memory system controller may determine the second temperature threshold based on an FF process corner performing faster at a higher temperature—e.g., the FF corner may utilize less voltage at a temperature that exceeds second temperature threshold. The memory system controller may compare the first temperature with the second temperature threshold. If the memory system controller determines the first temperature exceeds the second temperature threshold, it may proceed to block 425. If the memory system controller determines the second temperature does not exceed the second temperature threshold, it may proceed to block 450.

At 425, a voltage transition occurs. For example, the memory system may transition a voltage supplied to the core. The transition may be initiated by the memory system controller. In some examples, the memory system controller may transition a voltage supplied to the core from a first voltage to a second voltage based on determining that the first temperature is less than the first temperature threshold (e.g., transitioning from voltage 320 to voltage 325 as described with reference to FIG. 3). In other examples, the memory system controller may transition the voltage supplied to the core from the second voltage to the first voltage based on determining that the first temperature exceeds the second temperature threshold (e.g., transitioning from voltage 325 to voltage 320 as described with reference to FIG. 3). In some examples, the memory system controller may wait until a memory array is an idle state before transitioning the voltage—e.g., when there is a lack of operations being performed on memory cells of the memory array to avoid potential disruptions to the memory cells. In some cases, the memory system controller may transition from the first voltage to the second voltage by adjusting a resistance at an LDO coupled with a power supply line from the host system (e.g., power supply line 250) and the core. In some cases, the memory system controller may also log (e.g., record) the voltage transition in an event log register—e.g., the memory system controller may record a type of process corner, the event, and the voltage transition for debugging purposes.

At 430, a second temperature is determined. For example, the memory system may determine the second temperature. The second temperature may be determined at the memory system controller. In some examples, after detecting or determining a second event occurs at the memory system, the memory system controller may determine the second temperature of the core. For example, the memory system controller may utilize a sensor to determine the second temperature. In some examples, the memory system controller may experience a delay in detecting the event and determining the second temperature.

At 435, whether the second temperature exceeds a second temperature threshold is determined. For example, the memory system may determine if the second temperature exceeds a second temperature threshold. The determination may be made at the memory system controller. The memory system controller may compare the second temperature with the second temperature threshold. If the memory system controller determines the second temperature does not exceeds the second temperature threshold, it may proceed to block 440. If the memory system controller determines the second temperature does exceed the second temperature threshold, it may proceed to block 445.

At 440, whether the second temperature is less than a first temperature threshold is determined. For example, the memory system may determine if the second temperature is less than a first temperature threshold. The determination may be made at the memory system controller. The memory system controller may compare the first temperature with the second temperature threshold. If the memory system controller determines the second temperature is less than the first temperature threshold, it may proceed to block 445. If the memory system controller determines the first temperature is not less than the first temperature threshold, it may proceed to block 450.

At 445, a voltage transition occurs. For example, the memory system may transition a voltage supplied to the core. The transition may be initiated by the memory system controller. In some examples, the memory system controller may transition a voltage supplied to the core from the second voltage to the first voltage based on determining that the second temperature exceeds the second temperature threshold (e.g., transitioning from voltage 325 to voltage 320 as described with reference to FIG. 3). In other examples, the memory system controller may transition a voltage supplied to the core from the first voltage to the second voltage based on determining that the second temperature is less than the first temperature threshold (e.g., transitioning from voltage 320 to voltage 325 as described with reference to FIG. 3). In some examples, the memory system controller may wait until the core is an idle state before transitioning the voltage. In some cases, the memory system controller may transition from the second voltage to the first voltage by adjusting a resistance at the LDO coupled with the power supply line from the host system and the core. In some cases, the memory system controller may also log (e.g., record) the voltage transition in the event log register—e.g., the memory system controller may record a type of process corner, the event, and the voltage transition for debugging purposes.

At 440, a voltage is maintained. For example, the memory system may maintain a voltage supplied to the core. The voltage may be maintained by the memory system controller. In some examples, the memory system controller may determine either the first temperature or the second temperature is between the first temperature threshold and the second temperature threshold—e.g., in the temperature threshold window 335 as described with reference to FIG. 3. In such examples, the memory system controller may maintain the state of the voltage supplied to the core at the time the first temperature or second temperature was determined. For example, the memory system controller may maintain the first voltage if the first voltage is supplied to the core at the time the first temperature or the second temperature is determined or maintain the second voltage if the second voltage is supplied to the core at the time the first temperature or second temperature is determined. That is, the memory system controller may refrain from transitioning the voltage supplied to the core unless a determined temperature is greater than or less than both the first temperature threshold and the second temperature threshold. This may enable the memory system to refrain from constantly transitioning the voltage and reduce excess power consumption.

Figure 5:
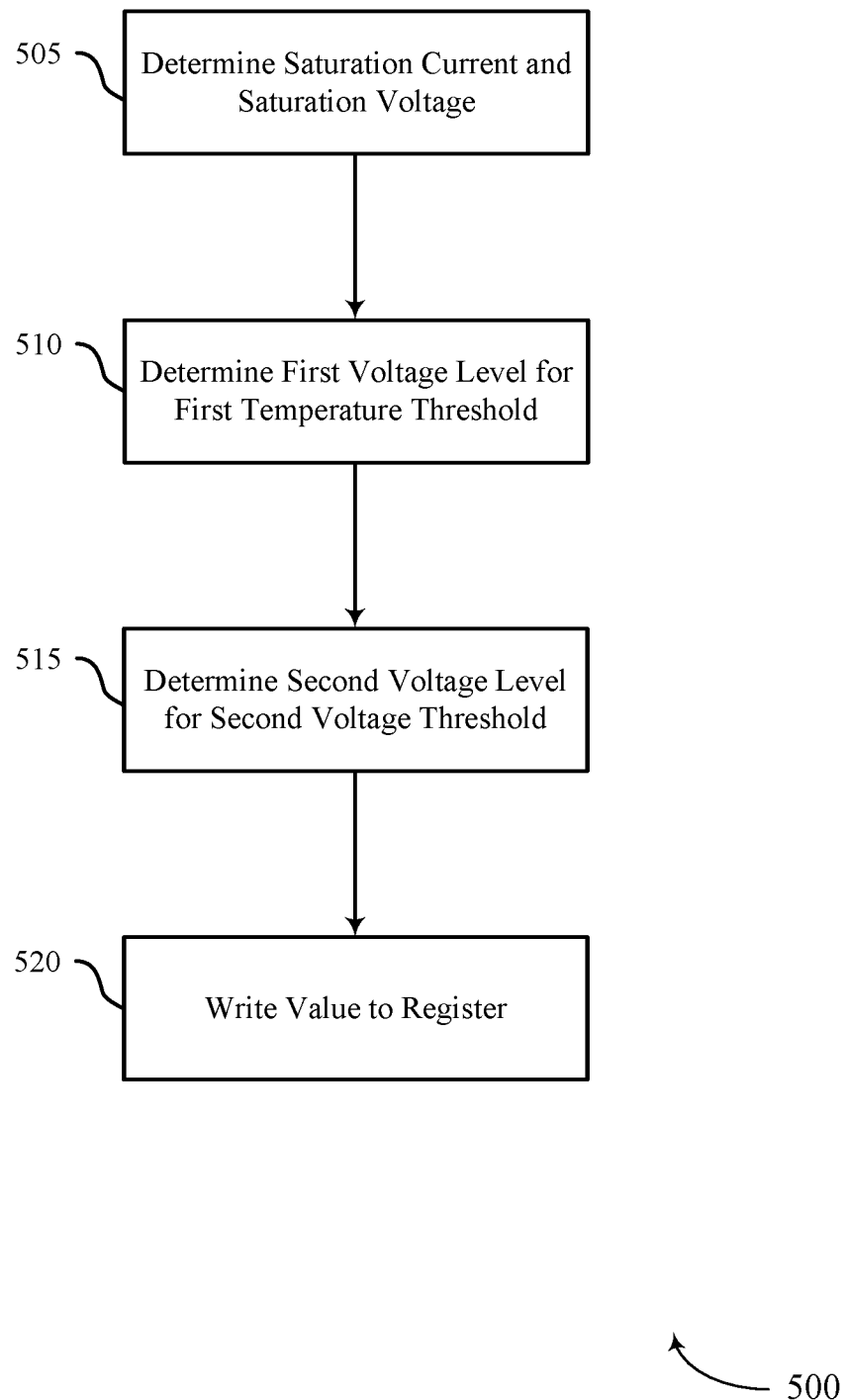
FIG. 5 illustrates an example of a process diagram that supports dynamic voltage supply for memory circuit in accordance with examples as disclosed herein.

FIG. 5 illustrates an example of a process diagram 500 that supports dynamic voltage supply for memory circuit in accordance with examples as disclosed herein. For example, the process diagram 400 may be performed by a system as described with reference to FIGS. 1 and 2 (e.g., system 200, host system 205, and memory system 210 as described with reference to FIG. 2). Although shown in a particular sequence or order, unless otherwise specified, the order of the processes may be modified. Thus, the illustrated examples are used as examples, and the illustrated processes may be performed in a different order, and some processes may be performed in parallel. Additionally, one or more processes may be omitted in various examples. Thus, not all processes are used in every example. Other process diagrams are possible. The process diagram 500 illustrates examples of a memory system selecting voltages to supply to a core (e.g., core 220 as described with reference to FIG. 2.

At 505, a saturation current and saturation voltage is determined. For example, a memory system may determine the saturation current and saturation voltage. The determination may be made at the memory system controller. In some examples, due to variations in the fabrication process, a first core component may have a different threshold voltage than a second core component—e.g., different NMOS and PMOS transistors may have different threshold voltages. For example, the core may include various process corners (e.g., FF, SS, TT, SF, FS) and each process corner may have a different threshold voltage—e.g., an SS process corner may have a higher saturated threshold voltage than an FF process corner. In some examples, the memory system controller may determine a type of process corner in the core by determining the saturation current and saturation voltage of a component of the core. That is, an SS component may have a higher saturated threshold voltage and a lower saturated current, and an FF component may have a lower saturated threshold voltage and a higher saturated current. The memory system controller may determine the type of process corner based on the determined saturated current and saturated threshold voltage. In some cases, the saturated current and the saturated voltage may be determined at or after the fabrication process—e.g., before the memory system is utilized.

At 510, a first voltage level for a first temperature threshold is determined. For example, the memory system may determine a first voltage level based on a first temperature threshold. The determination may be made at the memory system controller. In some examples, components of the core may be affected by a temperature. For example, components may perform faster at higher temperatures and slower at lower temperatures. In some examples, some process corners of the core may be more affected than other process corners by the temperature—e.g., SS process corners may have reduced performance in lower temperature and FF process corners may have reduced performance in higher temperatures. In such examples, the memory system controller may determine a first voltage to supply the core based on the process corner and the temperature—e.g., the memory system controller may determine a higher first voltage level for an SS corner at high temperatures than an FF corner at the same temperature.

At 515, a second voltage level for a second temperature threshold is determined. For example, the memory system may determine a second level based on a second temperature threshold. The determination may be made at the memory system controller. In some examples, the memory system controller may select a second voltage level to supply to the core based on the process corner and the temperature—e.g., the memory system controller may determine a higher second voltage level for the process corner at lower temperatures. In some cases, the memory system controller may determine two (2) temperature thresholds to avoid frequent transitions between the first voltage level and the second voltage level—e.g., there may be a threshold window (e.g., temperature threshold window 335) in which the memory system controller maintains the voltage level at a time a temperature is determined. In some examples, the first temperature threshold may be a higher temperature than the second temperature threshold. In such examples, the first voltage level may be less than the second voltage level—e.g., the core may utilize less voltage at higher temperatures. In some examples, the first voltage level and the second voltage level may be the same—e.g., for a type 2 SS process corner as described with reference to FIG. 2. By determining the first voltage level and the second voltage level, the memory system controller may reduce performance issues related to a type of process corner and temperature of the memory array—e.g., FF process corners may have a reduced voltage at higher temperatures to avoid current spikes and voltage drops.

At 520, a value is written. For example, the memory system may write the value to a register. The value may be written to the register by the memory system controller. In some examples, the memory system controller may store a value corresponding to the first voltage level and the second voltage level in a register or in a trim setting. For example, the memory system controller may store a first value corresponding to a first voltage level and a second voltage level of a first type of process corner and a second value corresponding to a first voltage level and a second voltage level of a second type of process corner—e.g., a first value for a TT process corner and a second value for a SS process corner. The memory system controller may write the value before the memory system is utilized—e.g., during or after the fabrication process before the memory system is utilized.

Figure 6:
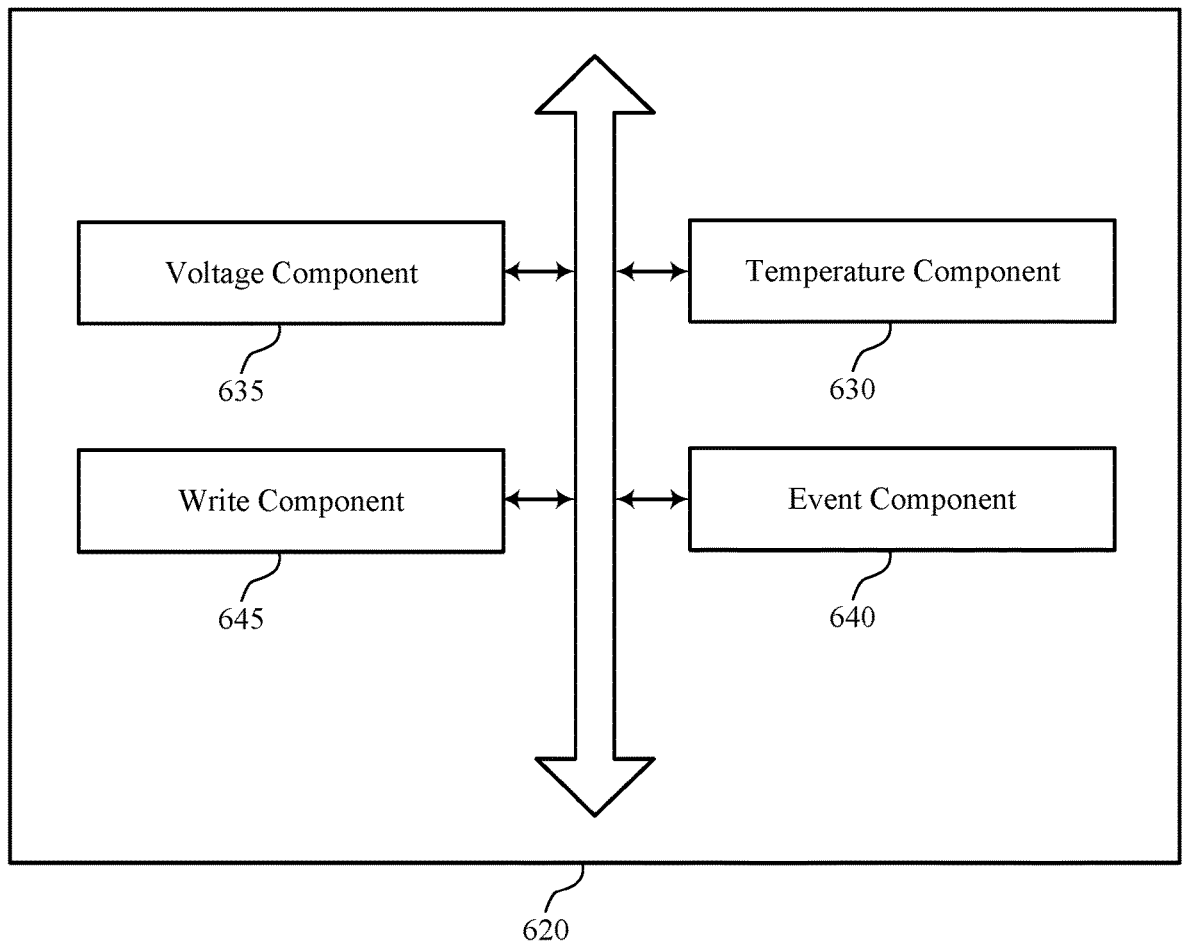
FIG. 6 shows a block diagram of a memory system that supports dynamic voltage supply for memory circuit in accordance with examples as disclosed herein.

FIG. 6 shows a block diagram 600 of a memory system 620 that supports dynamic voltage supply for memory circuit in accordance with examples as disclosed herein. The memory system 620 may be an example of aspects of a memory system as described with reference to FIGS. 1 through 5. The memory system 620, or various components thereof, may be an example of means for performing various aspects of dynamic voltage supply for memory circuit as described herein. For example, the memory system 620 may include a temperature component 630, a voltage component 635, an event component 640, a write component 645, or any combination thereof. Each of these components may communicate, directly or indirectly, with one another (e.g., via one or more buses).

The temperature component 630 may be configured as or otherwise support a means for determining, at a first time, whether a first temperature of the memory system is less than a first temperature threshold. In some examples, the temperature component 630 may be configured as or otherwise support a means for determining, at a second time after the first time, whether a second temperature of the memory system is greater than a second temperature threshold different than the first temperature threshold based at least in part on transitioning from the first voltage level to the second voltage level. In some cases, the temperature component 630 may be configured as or otherwise support a means for determining, at a third time after the second time, whether a third temperature of the memory system is less than the second temperature threshold and greater than the first temperature threshold based at least in part on transitioning from the second voltage level to the first voltage level. In some instances, the temperature component 630 may be configured as or otherwise support a means for determining, at a fourth time after the third time, whether a fourth temperature of the memory system is greater than the second temperature threshold based at least in part on maintaining the voltage. In some examples, the temperature component 630 may be configured as or otherwise support a means for determining, at a fifth time after the fourth time, whether a fifth temperature of the memory system is greater than the first temperature threshold and less than the second temperature threshold based at least in part on transitioning from the second voltage level to the first voltage level after the fourth time.

The voltage component 635 may be configured as or otherwise support a means for transitioning a voltage supplied to a controller from a first voltage level to a second voltage level based at least in part on determining that the first temperature is less than the first temperature threshold. In some instances, the voltage component 635 may be configured as or otherwise support a means for transitioning the voltage supplied to the controller from the second voltage level to the first voltage level based at least in part on determining that the second temperature is greater than the second temperature threshold. In some cases, the voltage component 635 may be configured as or otherwise support a means for maintaining the voltage supplied to the controller at the first voltage level based at least in part on determining that the third temperature is less than the second temperature threshold and greater than the first temperature threshold. In some instances, the voltage component 635 may be configured as or otherwise support a means for suppling the first voltage level based at least in part on a saturation current or a saturation voltage associated with components of the controller.

In some cases, the voltage component 635 may be configured as or otherwise support a means for transitioning the voltage of the controller from the first voltage level to the second voltage level based at least in part on determining that the fourth temperature is greater than the second temperature threshold. In some instances, the voltage component 635 may be configured as or otherwise support a means for maintaining the voltage supplied to the controller at the second voltage level based at least in part on determining that the fifth temperature is greater than the first temperature threshold and less than the second temperature threshold. In some examples, to support transitioning the voltage from the first level to the second level, the voltage component 635 may be configured as or otherwise support a means for transitioning a value in a register from a first value associated with a first resistance of a low dropout regulator to a second value associated with a second resistance of the low dropout regulator.

In some examples, the event component 640 may be configured as or otherwise support a means for determining a transition of the voltage supplied to the controller from a third voltage level associated with a deactivated state of the controller to the first voltage level, where the first temperature is determined at the first time based at least in part on determining the transition from the third voltage level to the first voltage level. In some instances, the event component 640 may be configured as or otherwise support a means for determining a reset of the voltage supplied to the controller, where the first temperature is determined at the first time based at least in part on determining the reset. In some cases, the event component 640 may be configured as or otherwise support a means for receiving a request associated with a link status with a host system, where the first temperature is determined at the first time based at least in part on receiving the request.

In some examples, the event component 640 may be configured as or otherwise support a means for receiving a command for the controller to exit a low-power state. In some examples, the voltage component 635 may be configured as or otherwise support a means for transitioning the voltage supplied to the controller from a third voltage level to the first voltage level, the third voltage level associated with the low-power state of the controller, where determining the first temperature at the first time is based at least in part on transitioning from the third voltage level to the first voltage level. In some instances, the event component 640 may be configured as or otherwise support a means for receiving a command for the controller to enter a low-power state, where determining the first temperature at the first time is based at least in part on receiving the command. In some cases, the event component 640 may be configured as or otherwise support a means for detecting whether the memory array is in an idle state, where transitioning the voltage supplied to the controller from the first voltage level to the second voltage level is based at least in part on detecting the memory array is in the idle state.

In some examples, the write component 645 may be configured as or otherwise support a means for writing a first value associated with the transition of the voltage supplied to the controller from the first voltage level to the second voltage level to a register based at least in part on transitioning the voltage supplied to the controller from the first voltage level to the second voltage level. In some instances, the write component 645 may be configured as or otherwise support a means for writing a second value associated with the transition of the voltage supplied to the controller from the second voltage level to the first voltage level to the register based at least in part on transitioning the voltage supplied to the controller from the second voltage level to the first voltage level.

Figure 7:
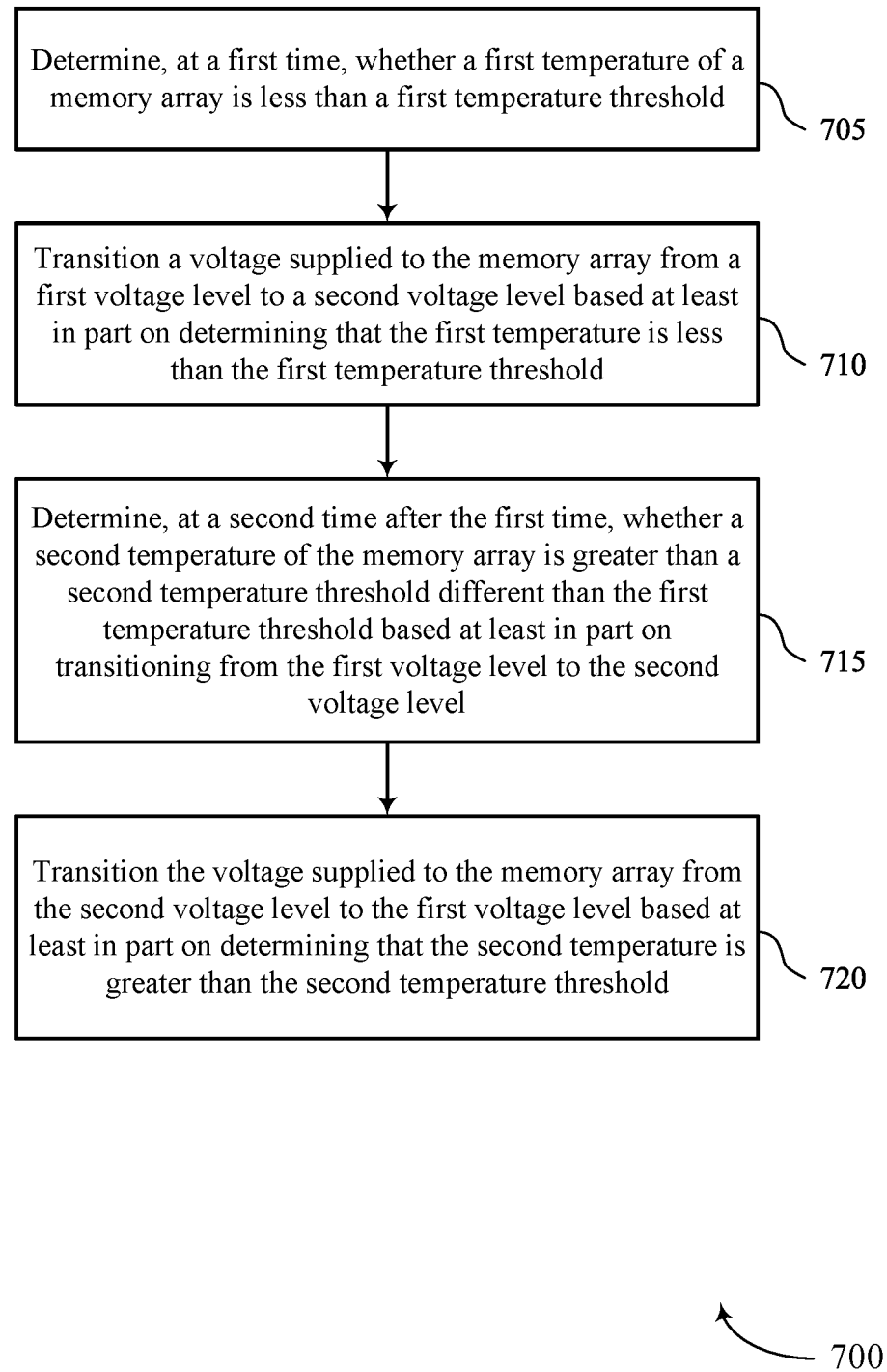
FIG. 7 shows a flowchart illustrating a method or methods that support dynamic voltage supply for memory circuit in accordance with examples as disclosed herein.

FIG. 7 shows a flowchart illustrating a method 700 that supports dynamic voltage supply for memory circuit in accordance with examples as disclosed herein. The operations of method 700 may be implemented by a memory system or its components as described herein. For example, the operations of method 700 may be performed by a memory system as described with reference to FIGS. 1 through 6. In some examples, a memory system may execute a set of instructions to control the functional elements of the device to perform the described functions. Additionally or alternatively, the memory system may perform aspects of the described functions using special-purpose hardware.

At 705, the method may include determining, at a first time, whether a first temperature of a controller is less than a first temperature threshold. The operations of 705 may be performed in accordance with examples as disclosed herein. In some examples, aspects of the operations of 705 may be performed by a temperature component 630 as described with reference to FIG. 6.

At 710, the method may include transitioning a voltage supplied to the controller from a first voltage level to a second voltage level based at least in part on determining that the first temperature is less than the first temperature threshold. The operations of 710 may be performed in accordance with examples as disclosed herein. In some examples, aspects of the operations of 710 may be performed by a voltage component 635 as described with reference to FIG. 6.

At 715, the method may include determining, at a second time after the first time, whether a second temperature of the controller is greater than a second temperature threshold different than the first temperature threshold based at least in part on transitioning from the first voltage level to the second voltage level. The operations of 715 may be performed in accordance with examples as disclosed herein. In some examples, aspects of the operations of 715 may be performed by a temperature component 630 as described with reference to FIG. 6.

At 720, the method may include transitioning the voltage supplied to the controller from the second voltage level to the first voltage level based at least in part on determining that the second temperature is greater than the second temperature threshold. The operations of 720 may be performed in accordance with examples as disclosed herein. In some examples, aspects of the operations of 720 may be performed by a voltage component 635 as described with reference to FIG. 6.

In some examples, an apparatus as described herein may perform a method or methods, such as the method 700. The apparatus may include, features, circuitry, logic, means, or instructions (e.g., a non-transitory computer-readable medium storing instructions executable by a processor) for determining, at a first time, whether a first temperature of a controller is less than a first temperature threshold, transitioning a voltage supplied to the controller from a first voltage level to a second voltage level based at least in part on determining that the first temperature is less than the first temperature threshold, determining, at a second time after the first time, whether a second temperature of the controller is greater than a second temperature threshold different than the first temperature threshold based at least in part on transitioning from the first voltage level to the second voltage level, and transitioning the voltage supplied to the controller from the second voltage level to the first voltage level based at least in part on determining that the second temperature is greater than the second temperature threshold.

Some examples of the method 700 and the apparatus described herein may further include operations, features, circuitry, logic, means, or instructions for determining, at a third time after the second time, whether a third temperature of the controller may be less than the second temperature threshold and greater than the first temperature threshold based at least in part on transitioning from the second voltage level to the first voltage level and maintaining the voltage supplied to the controller at the first voltage level based at least in part on determining that the third temperature may be less than the second temperature threshold and greater than the first temperature threshold.

Some instances of the method 700 and the apparatus described herein may further include operations, features, circuitry, logic, means, or instructions for determining, at a fourth time after the third time, whether a fourth temperature of the controller may be greater than the second temperature threshold based at least in part on maintaining the voltage, transitioning the voltage of the controller from the first voltage level to the second voltage level based at least in part on determining that the fourth temperature may be greater than the second temperature threshold, determining, at a fifth time after the fourth time, whether a fifth temperature of the controller may be greater than the first temperature threshold and less than the second temperature threshold based at least in part on transitioning from the second voltage level to the first voltage level after the fourth time, and maintaining the voltage supplied to the controller at the second voltage level based at least in part on determining that the fifth temperature may be greater than the first temperature threshold and less than the second temperature threshold.

Some instances of the method 700 and the apparatus described herein may further include operations, features, circuitry, logic, means, or instructions for determining a transition of the voltage supplied to the controller from a third voltage level associated with a deactivated state of the controller to the first voltage level, where the first temperature may be determined at the first time based at least in part on determining the transition from the third voltage level to the first voltage level.

Some cases of the method 700 and the apparatus described herein may further include operations, features, circuitry, logic, means, or instructions for determining a reset of the voltage supplied to the controller, where the first temperature may be determined at the first time based at least in part on determining the reset.

Some instances of the method 700 and the apparatus described herein may further include operations, features, circuitry, logic, means, or instructions for receiving a request associated with a link status with a host system, where the first temperature may be determined at the first time based at least in part on receiving the request.

Some cases of the method 700 and the apparatus described herein may further include operations, features, circuitry, logic, means, or instructions for receiving a command for the controller to exit a low-power state and transitioning the voltage supplied to the controller from a third voltage level to the first voltage level, the third voltage level associated with the low-power state of the controller, where determining the first temperature at the first time may be based at least in part on transitioning from the third voltage level to the first voltage level.

Some examples of the method 700 and the apparatus described herein may further include operations, features, circuitry, logic, means, or instructions for receiving a command for the controller to enter a low-power state, where determining the first temperature at the first time may be based at least in part on receiving the command.

Some instances of the method 700 and the apparatus described herein may further include operations, features, circuitry, logic, means, or instructions for writing a first value associated with the transition of the voltage supplied to the controller from the first voltage level to the second voltage level to a register based at least in part on transitioning the voltage supplied to the controller from the first voltage level to the second voltage level and writing a second value associated with the transition of the voltage supplied to the controller from the second voltage level to the first voltage level to the register based at least in part on transitioning the voltage supplied to the controller from the second voltage level to the first voltage level.

In some instances of the method 700 and the apparatus described herein, transitioning the voltage from the first level to the second level may include operations, features, circuitry, logic, means, or instructions for transitioning a value in a register from a first value associated with a first resistance of a low dropout regulator to a second value associated with a second resistance of the low dropout regulator.

In some cases of the method 700 and the apparatus described herein, the first voltage level may be based at least in part on a saturation current or a saturation voltage associated with components of the controller.

Some instances of the method 700 and the apparatus described herein may further include operations, features, circuitry, logic, means, or instructions for detecting whether the memory array may be in an idle state, where transitioning the voltage supplied to the controller from the first voltage level to the second voltage level may be based at least in part on detecting the memory array may be in the idle state.

It should be noted that the methods described above describe possible implementations, and that the operations and the steps may be rearranged or otherwise modified and that other implementations are possible. Further, portions from two or more of the methods may be combined.

An apparatus is described. The apparatus may include a memory array and a controller coupled with the memory array, the controller configurable to cause the apparatus to determine, at a first time, whether a first temperature of the apparatus is less than a first temperature threshold, transition a voltage supplied to the controller from a first voltage level to a second voltage level based at least in part on determining that the first temperature is less than the first temperature threshold, determine, at a second time after the first time, whether a second temperature of the apparatus is greater than a second temperature threshold different than the first temperature threshold based at least in part on transitioning from the first voltage level to the second voltage level, and transition the voltage supplied to the controller from the second voltage level to the first voltage level based at least in part on determining that the second temperature is greater than the second temperature threshold.

In some examples, the controller may be further configurable to determine, at a third time after the second time, whether a third temperature of the apparatus may be less than the second temperature threshold and greater than the first temperature threshold based at least in part on transitioning from the second voltage level to the first voltage level and maintain the voltage supplied to the controller at the first voltage level based at least in part on determining that the third temperature may be less than the second temperature threshold and greater than the first temperature threshold.

In some cases, the controller may be further configurable to determine, at a fourth time after the third time, whether a fourth temperature of the apparatus may be greater than the second temperature threshold based at least in part on maintaining the voltage, transition the voltage of the controller from the first voltage level to the second voltage level based at least in part on determining that the fourth temperature may be greater than the second temperature threshold, determine, at a fifth time after the fourth time, whether a fifth temperature of the apparatus may be greater than the first temperature threshold and less than the second temperature threshold based at least in part on transitioning from the second voltage level to the first voltage level after the fourth time, and maintain the voltage supplied to the controller at the second voltage level based at least in part on determining that the fifth temperature may be greater than the first temperature threshold and less than the second temperature threshold.

In some instances, the controller may be further configurable to determine a transition of the voltage supplied to the controller from a third voltage level associated with a deactivated state of the controller to the first voltage level, where the first temperature may be determined at the first time based at least in part on determining the transition from the third voltage level to the first voltage level.

In some cases, the controller may be further configurable to determine a reset of the voltage supplied to the controller, where the first temperature may be determined at the first time based at least in part on determining the reset.

In some instances, the controller may be further configurable to receive a request associated with a link status with a host system, where the first temperature may be determined at the first time based at least in part on receiving the request.

In some examples the controller may be further configurable to receive a command for the controller to exit a low-power state and transition the voltage supplied to the controller from a third voltage level to the first voltage level, the third voltage level associated with the low-power state of the controller, where determining the first temperature at the first time may be based at least in part on transitioning from the third voltage level to the first voltage level.

In some cases, the controller may be further configurable to receive a command for the controller to enter a low-power state, where determining the first temperature at the first time may be based at least in part on receiving the command.

In some instances, the controller may be further configurable to write a first value associated with the transition of the voltage supplied to the controller from the first voltage level to the second voltage level to a register based at least in part on transitioning the voltage supplied to the controller from the first voltage level to the second voltage level and write a second value associated with the transition of the voltage supplied to the controller from the second voltage level to the first voltage level to the register based at least in part on transitioning the voltage supplied to the controller from the second voltage level to the first voltage level.

In some examples, the apparatus may include a low dropout regulator, where the controller may be further configurable to cause the apparatus to transition a value in a register from a first value associated with a first resistance of the low dropout regulator to a second value associated with a second resistance of the low dropout regulator, where the controller may be configured to transition the voltage supplied to the controller from the first voltage level to the second voltage level based at least in part on transitioning the value.

In some examples of the apparatus, the first voltage level may be based at least in part on a saturation current or a saturation voltage associated with components of the controller.

In some examples, the controller may be further configurable to detect whether the memory array may be in an idle state, where the controller may be configured to transition the voltage supplied to the controller from the first voltage level to the second voltage level based at least in part on detecting the memory array in the idle state.

Another apparatus is described. The apparatus may include a memory array and a controller coupled with the memory array, the controller configurable to cause the apparatus to identify an event associated with the controller, determine whether a first temperature of the apparatus is less than a first temperature threshold and less than a second temperature threshold different than the first temperature threshold based at least in part on identifying the event, and transition a voltage supplied to the controller from a first voltage level to a second voltage level based at least in part on determining that the first temperature of the apparatus is less than the first temperature threshold and less than the second temperature threshold.

In some examples, the controller may be further configurable to identify a second event associated with the controller, determine whether a second temperature of the apparatus may be greater than the first temperature threshold and less than the second temperature threshold based at least in part on identifying the second event, and maintaining the voltage supplied to the controller at the second voltage level based at least in part on determining that the second temperature may be greater than the first temperature threshold and less than the second temperature threshold.

In some cases, the controller may be further configurable to identify a second event associated with the controller, determine whether a second temperature of the apparatus may be greater than the first temperature threshold and may be greater than the second temperature threshold based at least in part on identifying the second event, and transitioning the voltage supplied to the controller from the second voltage level to the first voltage level based at least in part on determining that the second temperature may be greater than the first temperature threshold and the second temperature threshold.

In some instances, the controller may be further configurable to detect a transition of the controller from a first power state to a second power state.

In some cases, the controller may be further configurable to detect a reset of the voltage supplied to the controller.

In some examples, the controller may be further configurable to receive a command associated with transitioning the controller from a first power state to a second power state.

Another apparatus is described. The apparatus may include a memory array and a controller coupled with the memory array, the controller configurable to cause the apparatus to identify a saturation current associated with components of the controller or a saturation voltage associated with components of the controller, determine a first voltage level to supply the controller at a first temperature threshold and a second voltage level to supply the controller at a second temperature threshold different than the first temperature threshold based at least in part on identifying the saturation current or the saturation voltage, and write a value to a register associated with the first voltage level and the second voltage level based at least in part on determining the first voltage level and the second voltage level.

In some cases of the apparatus, the first temperature threshold may be greater than the second temperature threshold and the first voltage level may be less than the second voltage level based at least in part on determining the saturation current or the saturation voltage.

In some instances of the apparatus, the first voltage level may be the same as the second voltage level based at least in part on determining the saturation current or the saturation voltage.

In some cases, the apparatus may include a second controller, where the controller may be further configurable to cause the apparatus to, identify a second saturation current or a second saturation voltage associated with second components of the second controller, and determine a third voltage level to supply the controller at the first temperature threshold and determine a fourth voltage level to supply the controller at the second temperature threshold based at least in part on identifying the second saturation current or the second saturation voltage, where the third voltage level may be different than the first voltage level and the fourth voltage level may be different than the second voltage level.

In some examples of the apparatus, the components include NMOS transistors, PMOS transistors, or a combination thereof.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A memory system, comprising:
   a memory array; and
   processing circuitry coupled with the memory array, the processing circuitry configurable to cause the memory system to:
   determine, at a first time, whether a first temperature of the memory system is less than a first temperature threshold;
   transition a voltage supplied to the processing circuitry from a first voltage level to a second voltage level based at least in part on determining that the first temperature is less than the first temperature threshold;
   determine, at a second time after the first time, whether a second temperature of the memory system is greater than a second temperature threshold different than the first temperature threshold based at least in part on transitioning from the first voltage level to the second voltage level; and
   transition the voltage supplied to the processing circuitry from the second voltage level to the first voltage level based at least in part on determining that the second temperature is greater than the second temperature threshold.

2. The memory system of claim 1, wherein the processing circuitry is further configurable to cause the memory system to:
   determine, at a third time after the second time, whether a third temperature of the memory system is less than the second temperature threshold and greater than the first temperature threshold based at least in part on transitioning from the second voltage level to the first voltage level; and
   maintain the voltage supplied to the processing circuitry at the first voltage level based at least in part on determining that the third temperature is less than the second temperature threshold and greater than the first temperature threshold.

3. The memory system of claim 2, wherein the processing circuitry is further configurable to cause the memory system to:
   determine, at a fourth time after the third time, whether a fourth temperature of the memory system is greater than the second temperature threshold based at least in part on maintaining the voltage;
   transition the voltage of the processing circuitry from the first voltage level to the second voltage level based at least in part on determining that the fourth temperature is greater than the second temperature threshold;
   determine, at a fifth time after the fourth time, whether a fifth temperature of the memory system is greater than the first temperature threshold and less than the second temperature threshold based at least in part on transitioning from the second voltage level to the first voltage level after the fourth time; and
   maintain the voltage supplied to the processing circuitry at the second voltage level based at least in part on determining that the fifth temperature is greater than the first temperature threshold and less than the second temperature threshold.

4. The memory system of claim 1, wherein the processing circuitry is further configurable to cause the memory system to:
   determine a transition of the voltage supplied to the processing circuitry from a third voltage level associated with a deactivated state of the processing circuitry to the first voltage level, wherein the first temperature is determined at the first time based at least in part on determining the transition from the third voltage level to the first voltage level.

5. The memory system of claim 1, wherein the processing circuitry is further configurable to cause the memory system to:
   determine a reset of the voltage supplied to the processing circuitry, wherein the first temperature is determined at the first time based at least in part on determining the reset.

6. The memory system of claim 1, wherein the processing circuitry is further configurable to cause the memory system to:
   receive a request associated with a link status with a host system, wherein the first temperature is determined at the first time based at least in part on receiving the request.

7. The memory system of claim 1, wherein the processing circuitry is further configurable to cause the memory system to:
   receive a command for the processing circuitry to exit a low-power state; and
   transition the voltage supplied to the processing circuitry from a third voltage level to the first voltage level, the third voltage level associated with the low-power state of the processing circuitry, wherein determining the first temperature at the first time is based at least in part on transitioning from the third voltage level to the first voltage level.

8. The memory system of claim 1, wherein the processing circuitry is further configurable to cause the memory system to:
   receive a command for the processing circuitry to enter a low-power state, wherein determining the first temperature at the first time is based at least in part on receiving the command.

9. The memory system of claim 1, wherein the processing circuitry is further configurable to cause the memory system to:
   write a first value associated with the transition of the voltage supplied to the processing circuitry from the first voltage level to the second voltage level to a register based at least in part on transitioning the voltage supplied to the processing circuitry from the first voltage level to the second voltage level; and
   write a second value associated with the transition of the voltage supplied to the processing circuitry from the second voltage level to the first voltage level to the register based at least in part on transitioning the voltage supplied to the processing circuitry from the second voltage level to the first voltage level.

10. The memory system of claim 1, further comprising:
    a low dropout regulator, wherein the processing circuitry is further configurable to cause the memory system to:
    transition a value in a register from a first value associated with a first resistance of the low dropout regulator to a second value associated with a second resistance of the low dropout regulator, wherein the processing circuitry is configured to transition the voltage supplied to the processing circuitry from the first voltage level to the second voltage level based at least in part on transitioning the value.

11. The memory system of claim 1, wherein the first voltage level is based at least in part on a saturation current or a saturation voltage associated with components of the processing circuitry.

12. The memory system of claim 1, wherein the processing circuitry is further configurable to cause the memory system to:
detect whether the memory array is in an idle state, wherein the processing circuitry is configured to transition the voltage supplied to the processing circuitry from the first voltage level to the second voltage level based at least in part on detecting the memory array in the idle state.

13. A memory system, comprising:
a memory array; and
processing circuitry coupled with the memory array, the processing circuitry configurable to cause the memory system to:
identify an event associated with the processing circuitry;
determine whether a first temperature of the memory system is less than a first temperature threshold and less than a second temperature threshold different than the first temperature threshold based at least in part on identifying the event; and
transition a voltage supplied to the processing circuitry from a first voltage level to a second voltage level based at least in part on determining that the first temperature of the memory system is less than the first temperature threshold and less than the second temperature threshold.

14. The memory system of claim 13, wherein the processing circuitry is further configurable to cause the memory system to:
identify a second event associated with the processing circuitry;
determine whether a second temperature of the memory system is greater than the first temperature threshold and less than the second temperature threshold based at least in part on identifying the second event; and
maintaining the voltage supplied to the processing circuitry at the second voltage level based at least in part on determining that the second temperature is greater than the first temperature threshold and less than the second temperature threshold.

15. The memory system of claim 13, wherein the processing circuitry is further configurable to cause the memory system to:
identify a second event associated with the processing circuitry;
determine whether a second temperature of the memory system is greater than the first temperature threshold and is greater than the second temperature threshold based at least in part on identifying the second event; and
transitioning the voltage supplied to the processing circuitry from the second voltage level to the first voltage level based at least in part on determining that the second temperature is greater than the first temperature threshold and the second temperature threshold.

16. The memory system of claim 13, wherein, to identify the event, the processing circuitry is further configurable to cause the memory system to:
detect a transition of the processing circuitry from a first power state to a second power state.

17. The memory system of claim 13, wherein to identify the event the processing circuitry is further configurable to cause the memory system to:
detect a reset of the voltage supplied to the processing circuitry.

18. The memory system of claim 13, wherein, to identify the event, the processing circuitry is further configurable to cause the memory system to:
receive a command associated with transitioning the processing circuitry from a first power state to a second power state.

19. A memory system, comprising:
a memory array; and
processing circuitry coupled with the memory array, the processing circuitry configurable to cause the memory system to:
identify a saturation current associated with components of the processing circuitry or a saturation voltage associated with the components of the processing circuitry;
determine a first voltage level to supply the processing circuitry at a first temperature threshold and a second voltage level to supply the processing circuitry at a second temperature threshold different than the first temperature threshold based at least in part on identifying the saturation current or the saturation voltage; and
write a value to a register associated with the first voltage level and the second voltage level based at least in part on determining the first voltage level and the second voltage level.

20. The memory system of claim 19, wherein the first temperature threshold is greater than the second temperature threshold and the first voltage level is less than the second voltage level based at least in part on determining the saturation current or the saturation voltage.

21. The memory system of claim 19, wherein the first voltage level is the same as the second voltage level based at least in part on determining the saturation current or the saturation voltage.

22. The memory system of claim 19,
wherein the processing circuitry is further configurable to cause the memory system to:
identify a second saturation current or a second saturation voltage associated with second components of the processing circuitry; and
determine a third voltage level to supply the processing circuitry at the first temperature threshold and determine a fourth voltage level to supply the processing circuitry at the second temperature threshold based at least in part on identifying the second saturation current or the second saturation voltage, wherein the third voltage level is different than the first voltage level and the fourth voltage level is different than the second voltage level.

23. The memory system of claim 19, wherein the components comprise N-channel metal-oxide-semiconductor (NMOS) transistors, P-channel metal-oxide-semiconductor (PMOS) transistors, or a combination thereof.

24. A non-transitory computer-readable medium storing code comprising instructions, which when executed by a processor of an electronic device, cause the electronic device to:
determine, at a first time, whether a first temperature of the non-transitory computer-readable medium is less than a first temperature threshold;
transition a voltage supplied to a controller from a first voltage level to a second voltage level based at least in part on determining that the first temperature is less than the first temperature threshold;
determine, at a second time after the first time, whether a second temperature of the non-transitory computer-readable medium is greater than a second temperature threshold different than the first temperature threshold based at least in part on transitioning from the first voltage level to the second voltage level; and transition the voltage supplied to the controller from the second voltage level to the first voltage level based at least in part on determining that the second temperature is greater than the second temperature threshold.

25. The non-transitory computer-readable medium of claim 24, wherein the instructions, when executed by the processor of the electronic device, further cause the electronic device to:

determine, at a third time after the second time, whether a third temperature of the non-transitory computer-readable medium is less than the second temperature threshold and greater than the first temperature threshold based at least in part on transitioning from the second voltage level to the first voltage level; and maintain the voltage supplied to the controller at the first voltage level based at least in part on determining that the third temperature is less than the second temperature threshold and greater than the first temperature threshold.

26. The non-transitory computer-readable medium of claim 25, wherein the instructions, when executed by the processor of the electronic device, further cause the electronic device to:

determine, at a fourth time after the third time, whether a fourth temperature of the non-transitory computer-readable medium is greater than the second temperature threshold based at least in part on maintaining the voltage;

transition the voltage of the controller from the first voltage level to the second voltage level based at least in part on determining that the fourth temperature is greater than the second temperature threshold;

determine at a fifth time after the fourth time, whether a fifth temperature of the non-transitory computer-readable medium is greater than the first temperature threshold and less than the second temperature threshold based at least in part on transitioning from the second voltage level to the first voltage level after the fourth time; and maintain the voltage supplied to the controller at the second voltage level based at least in part on determining that the fifth temperature is greater than the first temperature threshold and less than the second temperature threshold.

27. The non-transitory computer-readable medium of claim 24, wherein the instructions, when executed by the processor of the electronic device, further cause the electronic device to determine a transition of the voltage supplied to the controller from a third voltage level associated with a deactivated state of the controller to the first voltage level, wherein the first temperature is determined at the first time based at least in part on determining the transition from the third voltage level to the first voltage level.

28. The non-transitory computer-readable medium of claim 24, wherein the instructions, when executed by the processor of the electronic device, further cause the electronic device to determine a reset of the voltage supplied to the controller, wherein the first temperature is determined at the first time based at least in part on determining the reset.

29. The non-transitory computer-readable medium of claim 24, wherein the instructions, when executed by the processor of the electronic device, further cause the electronic device to receive a request associated with a link status with a host system, wherein the first temperature is determined at the first time based at least in part on receiving the request.

30. The non-transitory computer-readable medium of claim 24, wherein the instructions, when executed by the processor of the electronic device, further cause the electronic device to:

receive a command for the controller to exit a low-power state; and transition the voltage supplied to the controller from a third voltage level to the first voltage level, the third voltage level associated with the low-power state of the controller, wherein determining the first temperature at the first time is based at least in part on transitioning from the third voltage level to the first voltage level.

31. The non-transitory computer-readable medium of claim 24, wherein the instructions, when executed by the processor of the electronic device, further cause the electronic device to receive a command for the controller to enter a low-power state, wherein determining the first temperature at the first time is based at least in part on receiving the command.

32. The non-transitory computer-readable medium of claim 24, wherein the instructions, when executed by the processor of the electronic device, further cause the electronic device to:

write a first value associated with the transition of the voltage supplied to the controller from the first voltage level to the second voltage level to a register based at least in part on transitioning the voltage supplied to the controller from the first voltage level to the second voltage level; and write a second value associated with the transition of the voltage supplied to the controller from the second voltage level to the first voltage level to the register based at least in part on transitioning the voltage supplied to the controller from the second voltage level to the first voltage level.

33. A non-transitory computer-readable medium storing code comprising instructions, which when executed by a processor of an electronic device, cause the electronic device to:

identify an event associated with a controller;

determine whether a first temperature of the non-transitory computer-readable medium is less than a first temperature threshold and less than a second temperature threshold different than the first temperature threshold based at least in part on identifying the event; and transition a voltage supplied to the controller from a first voltage level to a second voltage level based at least in part on determining that the first temperature of the non-transitory computer-readable medium is less than the first temperature threshold and less than the second temperature threshold.

34. The non-transitory computer-readable medium of claim 33, wherein the instructions, when executed by the processor of the electronic device, further cause the electronic device to:

identify a second event associated with the controller;

determine whether a second temperature of the non-transitory computer-readable medium is greater than the first temperature threshold and less than the second temperature threshold based at least in part on identifying the second event; and maintaining the voltage supplied to the controller at the second voltage level based at least in part on determining that the second temperature is greater than the first temperature threshold and less than the second temperature threshold.

35. The non-transitory computer-readable medium of claim 33, wherein the instructions, when executed by the processor of the electronic device, further cause the electronic device to:
identify a second event associated with the controller;
determine whether a second temperature of the non-transitory computer-readable medium is greater than the first temperature threshold and is great than the second temperature threshold based at least in part on identifying the second event; and
transitioning the voltage supplied to the controller from the second voltage level to the first voltage level based at least in part on determining that the second temperature is greater than the first temperature threshold and the second temperature threshold.

* * * * *